United States Patent
Green et al.

(10) Patent No.: US 6,797,525 B2
(45) Date of Patent: Sep. 28, 2004

(54) FABRICATION PROCESS FOR A SEMICONDUCTOR DEVICE HAVING A METAL OXIDE DIELECTRIC MATERIAL WITH A HIGH DIELECTRIC CONSTANT, ANNEALED WITH A BUFFERED ANNEAL PROCESS

(75) Inventors: Martin L. Green, Summit, NJ (US); Glen D. Wilk, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/151,887

(22) Filed: May 22, 2002

(65) Prior Publication Data

US 2003/0219972 A1 Nov. 27, 2003

(51) Int. Cl.[7] .................... H01L 21/00; H01L 21/8242
(52) U.S. Cl. .................... 438/3; 438/240; 438/216; 438/261; 438/591

(58) Field of Search .................... 438/623, 3, 240, 438/216, 261, 287, 591

(56) References Cited

U.S. PATENT DOCUMENTS

| | | | | |
|---|---|---|---|---|
| 4,521,951 A | * | 6/1985 | Croset et al. | 438/393 |
| 5,851,841 A | * | 12/1998 | Ushikubo et al. | 438/240 |
| 6,445,033 B1 | * | 9/2002 | Hasegawa | 257/324 |

* cited by examiner

Primary Examiner—Thanh Nguyen
(74) Attorney, Agent, or Firm—Dickstein Shapiro Morin & Oshinsky LLP

(57) ABSTRACT

A method of forming an annealed high-K metal oxide transistor gate structure is disclosed. A metal oxide layer is formed over a semiconductor substrate. The metal oxide layer undergoes a buffered annealed process in an oxygen atmosphere to anneal the metal oxide layer at or below the thermodynamic chemical equilibrium of $SiO/SiO_2$ and at or above the thermodynamic chemical equilibrium of the metal oxide layer.

18 Claims, 5 Drawing Sheets

FABRICATION PROCESS FOR A SEMICONDUCTOR DEVICE HAVING A METAL OXIDE DIELECTRIC MATERIAL WITH A HIGH DIELECTRIC CONSTANT, ANNEALED WITH A BUFFERED ANNEAL PROCESS

BACKGROUND OF THE INVENTION

1. Field of the Invention

The present invention relates to the field of semiconductor devices, and more specifically to a fabrication process for a semiconductor device having a metal oxide dielectric material with a high dielectric constant.

2. Description of the Related Art

As the dimensions of the MOS transistor are scaled down, the thickness of its gate oxide, typically $SiO_2$, decreases accordingly. Reducing the $SiO_2$ layer to an ultrathin thickness results in charge carrier leakage by tunneling conduction as the ultrathin $SiO_2$ gate oxide layer no longer functions as an effective insulator.

Tunneling conduction also causes a faster dissipation of stored charge resulting in, for example, shortened battery life in portable devices such as cellular telephones and laptop computers. Typically, the gate dielectric layer used in a MOS transistor is an $SiO_2$ layer which has a dielectric constant of 3.9. Alternative gate oxide materials possessing a higher dielectric constant than $SiO_2$ would allow one to achieve the same gate capacitance in a thicker (physical thickness) gate dielectric layer. A thicker gate dielectric layer possessing a higher dielectric constant would provide for reduced tunnel leakage, while resulting in the same or larger gate capacitance as an $SiO_2$ layer.

Typical high-K materials which have been proposed for use as a gate oxide are metal oxides such as e.g., $HfO_2$, $Al_2O_3$, $La_2O_3$, $Ta_2O_5$, $ZrO_2$, $TiO_2$, and combinations of these metal oxides with $SiO_2$ (i.e., forming silicates) and $Al_2O_3$ (i.e., forming aluminates). The term silicate as used herein is a metal in combination with $SiO_2$ or SiON forming a silicate or silicate oxynitride structure, or a nitrided silicate structure with the top portion of the silicate being converted to a nitride (for example, by plasma nitridation, thermal nitridation, or implantation by nitrogen atoms; using techniques known to those skilled in the art). The term aluminate, as used herein is a metal in combination with $Al_2O_3$ or AlON forming an aluminate or aluminate oxynitride structure, or a nitrided aluminate structure with the top portion of the aluminate being converted to a nitride (for example, by plasma nitridation, thermal nitridation, or implantation by nitrogen atoms; using techniques known to those skilled in the art). These materials are used in lieu of or in conjunction with the $SiO_2$ layer.

However, current high-K dielectric gate layers result in devices that suffer from low carrier mobility and drive current. Mobility degradation results from coulombic scattering from charge centers in the gate dielectric, phonon scattering from the oxide, as well as from interfacial (Si/$SiO_2$) roughness at an Si/$SiO_2$ interface beneath the high-K gate dielectric. Elimination of the excess charge centers (commonly referred to as "fixed charge") and a more uniform Si/$SiO_2$ interface would minimize carrier mobility degradation, due to either coulombic scattering or scattering at the interface.

In addition, after formation of a high-K gate dielectric, thermal processing steps, such as annealing the high-K dielectric layer, are often carried out. Such processing steps can result in an undesirably thick $SiO_2$ interfacial layer due to reoxidation of the Si/$SiO_2$ (silicon/silicon dioxide) interface. Capacitance is inversely proportional to the thickness of the gate oxide layer. The presence of a significantly reoxidized thicker $SiO_2$ layer at the interface dramatically decreases the capacitance and transconductance of the device. The purpose in utilizing alternative gate oxide materials, such as high-K materials, is to largely replace the $SiO_2$ layer. Therefore, the presence of a significantly reoxidized thicker $SiO_2$ layer is undesirable.

Moreover, a high-K gate dielectric is typically formed under conditions that result in anomalies in the overall charge of the fabricated high-K gate dielectric. Growing high-K gate dielectrics naturally results in deviations from its ideal stoichiometric state since its formation occurs under conditions far from its thermodynamic equilibrium. For example, current methods of fabricating a high-K $ZrO_2$ gate dielectric result in formation of $ZrO_{2-x}$ rather than $ZrO_2$. Under ideal conditions, a fabricated high-K $ZrO_{2-x}$ gate dielectric would possess perfect stoichiometry (x equals zero) and have a net charge of zero since Zr has a +4 charge and O has a charge of –2. Realistically however, a net charge of zero is not obtained utilizing present fabrication methods and techniques. This results in an excess fixed charge in the high-K gate dielectric that can act as both coulombic scattering centers and as charge trapping centers. A substantial high fixed charge has been observed in all metal oxides that are used as alternatives to $SiO_2$ gate dielectric materials. Typically, high-K gate dielectrics have a fixed charge greater than $10^{12}/cm^2$; whereas, $SiO_2$ typically has a fixed charge of $10^{10}/cm^2$.

Additional problems arise when utilizing a metal oxide in lieu of $SiO_2$ as the gate dielectric material. An ultrathin layer of $SiO_2$ is typically provided as an interfacial layer when using a metal oxide rather than $SiO_2$ as the gate dielectric material. The interfacial layer is desirable because it facilitates nucleation and growth of the high-K dielectric layer. The interfacial layer also provides a good electrical interface with the silicon and has a low interfacial state density. Conventional methods of forming a metal oxide layer directly onto a silicon layer can also result in the inherent formation of an interfacial $SiO_2$ layer.

One problem with the Si/$SiO_2$ interface is graphically depicted in FIG. 1, which illustrates the thermodynamic chemical equilibrium between SiO (silicon oxide) and $SiO_2$ (silicon dioxide) as a function of partial pressure of oxygen and temperature. Above and at line 10 is an illustration of parameter space where $SiO_2$ forms (i.e., $SiO_2$ is stable and will grow in the presence of oxygen). For instance, silicon reacts in the presence of oxygen forming $SiO_2$. Whereas below line 10, $SiO_2$ does not form (i.e., $SiO_2$ is unstable) and if present, decomposes into SiO. In this case, silicon reacts in the presence of oxygen forming SiO. SiO is a volatile compound and thus, its formation and presence decomposes the interface between the underlying silicon substrate and interfacial layer.

Current methodologies for annealing high-K dielectric gate layers use annealing environments which occur above line 10 in FIG. 1. Annealing at conditions above line 10 results in significant reoxidation of the underlying $SiO_2$ layer which is undesirable as noted above. Current regimes also use annealing environments which do not restore or attempt to restore a high-K gate dielectric layer's stoichiometry and can even drive the high-K gate dielectric farther from its stoichiometric point.

As a result, alternate practices are desired for annealing a high-K gate dielectric layer to mitigate the noted problems.

A high-K gate dielectric must form an extremely high-quality interface with silicon or $SiO_2$ and must also withstand conventional transistor processing conditions. Accordingly, a desire and need exists for a process that yields a minimal amount of $SiO_2$ formed by further reoxidation of the silicon during the annealing process and which creates a high-K gate dielectric that is closer to its stoichiometric point to reduce the excess fixed charge.

BRIEF SUMMARY OF THE INVENTION

The present invention addresses the noted problems above and provides a method of fabricating a semiconductor device such as a MOSFET (metal-oxide semiconductor field effect transistor) utilizing a metal oxide dielectric material possessing a dielectric constant greater than $SiO_2$. Specifically, the invention provides a processing sequence for the post-deposition annealing of a high-K metal oxide dielectric layer to produce a metal oxide dielectric layer having a lower fixed charge (i.e., a high-K metal oxide layer that is closer to its stoichiometric point), resulting in a transistor device with higher carrier mobility and drive current.

To this end, the present invention provides a method and resulting structure having a metal oxide dielectric layer, fabricated over a substrate, which is annealed in a buffered oxygen atmosphere. An interfacial layer such as $SiO_2$ is optionally present between the metal oxide dielectric layer and substrate. The metal oxide dielectric layer is annealed by controlling the partial pressure of oxygen as a function of anneal temperature such that annealing occurs under conditions at or below the thermodynamic chemical equilibrium for $SiO/SiO_2$ and at or above the thermodynamic chemical equilibrium for the metal oxide dielectric layer. As a result of the buffered annealing, a high-K metal oxide dielectric layer with a reduced fixed charge and substantially improved carrier mobility characteristics is attained.

These and other features and advantages of the present invention will become more fully apparent from the following detailed description of exemplary embodiments of the invention which are provided in connection with the accompanying drawings.

DETAILED DESCRIPTION OF THE INVENTION

The present invention will be understood from the following detailed discussion of exemplary embodiments which is presented in connection with the accompanying drawings.

The present invention provides a method of fabricating a semiconductor device having a metal oxide dielectric layer with a high dielectric constant (high-K), annealed with a buffered anneal process. An interfacial layer such as $SiO_2$ is optionally present between the metal oxide layer and substrate during the buffered anneal process. The buffered anneal process anneals the metal oxide dielectric layer in an oxygen atmosphere in which the partial pressure of oxygen is controlled as a function of anneal temperature such that annealing occurs under conditions at or below the thermodynamic chemical equilibrium for $SiO/SiO_2$ and at or above the thermodynamic chemical equilibrium for the metal oxide dielectric layer.

In the following description, specific details such as layer thicknesses, material compositions, process sequences, are set forth to provide a complete understanding of the present invention. However, as understood by those skilled in the art, many variations can be employed without departing from the spirit or scope of the invention.

For purposes of the present invention, a high-K gate dielectric is one that has a dielectric constant greater than 3.9 (i.e., the dielectric constant of $SiO_2$). Annealing is a general term that means thermal treatment to alleviate some condition such as stress, phase separation, or deviation from stoichiometry. Whereas, a buffered anneal process is an anneal process carried out in a buffered atmosphere, such as an atmosphere in which the partial pressure of a gaseous element is controlled by the chemical equilibrium between two other gases. In the present invention, the $P_{O2}$ (partial pressure of oxygen) is controlled by the chemical equilibrium between, for example, $CO_2/CO$ (carbon dioxide/carbon monoxide) or $H_2O/H_2$ (water/hydrogen).

Figure 2A:
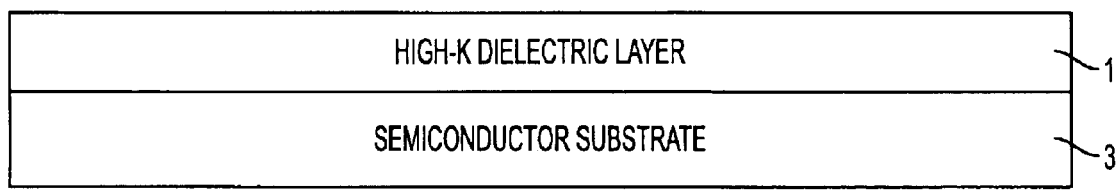
FIG. 2A is a cross-sectional view of a high-K metal oxide dielectric layer formed directly on a substrate prior to undergoing a buffered anneal process.

In an embodiment of the present invention, a dielectric layer 1 is formed over a semiconductor substrate surface 3 as shown in FIG. 2A. The dielectric layer 1 is a high-K metal oxide dielectric layer. The substrate 3 may be a silicon substrate. Conventional methods and techniques are used to form the high-K metal oxide dielectric layer 1 such as atomic layer deposition (ALD), chemical vapor deposition (CVD), molecular beam epitaxy (MBE), reactive sputtering, evaporation, and other processes well-known in the art.

For example purposes only, $Al_2O_3$ (aluminum oxide) is the metal oxide used in the following description of the invention. It should be appreciated, however, that other high-K metal oxide dielectrics such as unary oxides $ZrO_2$, $HfO_2$, $TiO_2$, and $Ta_2O_5$ can also be used. For instance, $Al_2O_3$ has a dielectric constant of approximately 9 to approximately 10; whereas $TiO_2$ has a dielectric constant from approximately 80 to approximately 110. In addition, unary oxides can combine with other unary oxides to form binary oxides such as $Zr_xTi_yO_z$, $BaTiO_3$, and $SrTiO_3$. Ternary and higher order metal oxides are also contemplated. Combinations of unary, binary, or ternary oxides with $SiO_2$ (i.e., silicate formation) or $Al_2O_3$ (i.e., aluminate formation) can also be used in forming the high-K metal oxide dielectric layer. Examples of metal silicate high-K materials include $ZrSiO_4$ and $HfSiO_4$. Examples of aluminate high-K materials include $Zr_xAl_yO_z$ and $Hf_xAl_yO_z$.

Figure 2B:
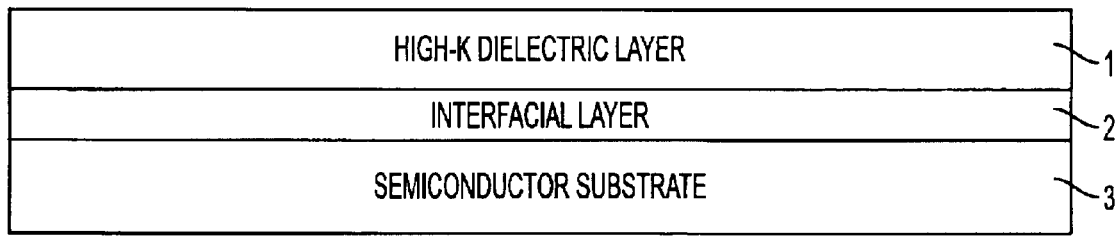
FIG. 2B is a cross-sectional view of a substrate, interfacial layer, and high-K metal oxide dielectric layer prior to undergoing a buffered anneal process.

An interfacial layer 2 can be optionally provided between the semiconductor substrate 3 and the high-K metal oxide dielectric layer 1 as shown in FIG. 2B. The interfacial layer 2 is a minimally thin layer of $SiO_2$, silicon oxynitride (Si—O—N), or chemically-prepared silicon oxide (Si—O—H) and is provided as an interfacial layer 2 between the deposited high-K metal oxide dielectric layer 1 and the underlying silicon substrate 3 through conventional methods and techniques. In essence, the interfacial layer 2 is a dielectric layer providing a good electrical interface between the high-K metal oxide dielectric layer 1 and the substrate 3. The interfacial layer 2 can also facilitate fabrication of the high-K metal oxide dielectric layer 1.

If employed, the interfacial layer 2 can be formed prior to, simultaneously, with, or even after formation of the high-K metal oxide dielectric layer 1. The fabrication conditions for forming a metal oxide directly on substrate 3, can result in the contemporaneous formation of the interfacial layer 2. For instance, a deposition chamber used for growth of a metal oxide may contain water vapor or $O_2$ which results in oxidation of the underlying silicon substrate 3 and contemporaneous formation of the interfacial layer 2 with the formation of the high-K metal oxide dielectric layer 1. Subsequent formation of the interfacial layer 2 occurs when the high-K metal oxide dielectric layer 1 is formed using a clean technique such as MBE. The interfacial layer 2 is then formed underneath the high-K metal oxide dielectric layer 1 in any subsequent reoxidation step. These techniques are well-known in the art.

For example purposes only, the following detailed description describes the presence of an optional interfacial layer 2 which is formed prior to the formation of the high-K metal oxide dielectric layer 1 as an $SiO_2$ interfacial layer 2. As mentioned previously, silicon oxynitride or a chemically-prepared silicon oxide (Si—O—H) may also be used as the interfacial layer 2. The exemplary $Al_2O_3$ dielectric layer is thus formed over the $SiO_2$, silicon oxynitride, or a chemically-prepared silicon oxide optional interfacial layer.

Figure 3:
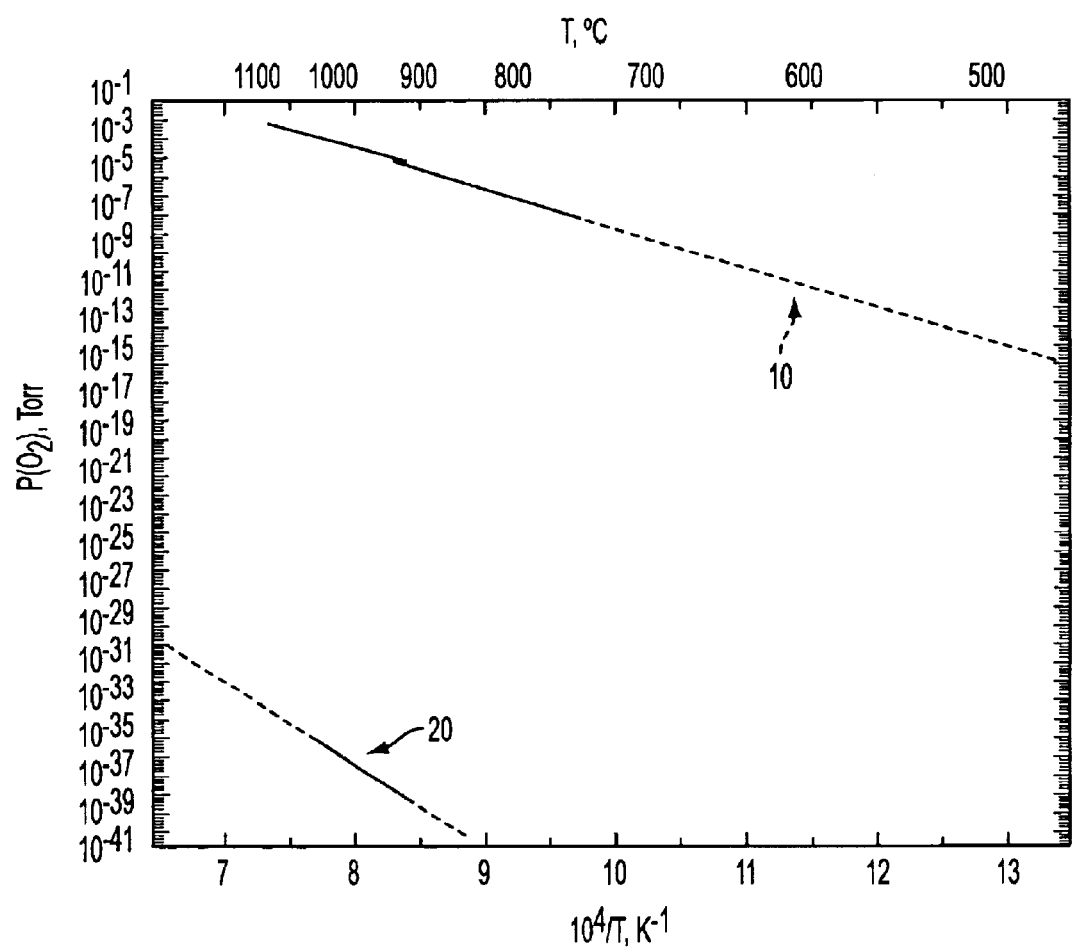
FIG. 3 is a graph illustrating the thermodynamic chemical equilibrium of $Al_2O_3$ and the thermodynamic chemical equilibrium between SiO and $SiO_2$.

FIG. 3 is a graph illustrating the parameters for the buffered annealing of the high-K $Al_2O_3$ dielectric layer under conditions where the partial pressures of oxygen are controlled. In FIG. 3, line 10 illustrates the $SiO/SiO_2$ (silicon oxide/silicon dioxide) thermodynamic chemical equilibrium at different temperatures. Line 10 is well-known in the art as Smith and Ghidini, and Morrison and Lander lines. See F. W. Smith and G. Ghidini, *"Reaction of Oxygen with Si (111) and (100): Critical Conditions for the Growth of $SiO_2$"*, J. Electrochem. Soc., 129, p. 1300 (1982); J. J. Lander and J. Morrison, J. App. Phys., 33, p. 2089 (1962). Line 20 of FIG. 3 illustrates a similar thermodynamic chemical equilibrium line for $Al_2O_3$. Other similar thermodynamic chemical equilibrium lines 20 exist for other metal oxides.

The present invention anneals the high-K metal oxide dielectric layer (here $Al_2O_3$) under conditions that occur at or between line 10, for the $SiO/SiO_2$ thermodynamic chemical equilibrium, and line 20, for the metal oxide thermodynamic chemical equilibrium (here the thermodynamic chemical equilibrium for $Al_2O_3$). Therefore,) the embodiment of the present invention uses a buffered anneal process that occurs under conditions between the $SiO/SiO_2$ thermodynamic chemical equilibrium line 10, as depicted in FIG. 3, and the $M_xO_y$ thermodynamic chemical equilibrium line 20 of FIG. 3, where M is any metal utilized in forming the high-K metal oxide dielectric layer. As noted, $Al_2O_3$ is utilized as an exemplary $M_xO_y$ throughout the detailed description. In addition, the buffered anneal process can also be applied to binary, ternary, and other multi-component oxides.

The buffered anneal process is conducted by controlling the partial pressure of oxygen ($P_{O2}$) at a given anneal temperature (i.e., at different temperature regimes). The buffered anneal can be carried out under conditions where the $P_{O2}$ can range from approximately 10 Torr to approximately $10^{-40}$ Torr with anneal process temperatures ranging from approximately 400° C. to approximately 1200° C. as shown in FIG. 3.

For a given anneal temperature, a certain desired $P_{O2}$ is achieved by selecting the buffered environment. The selected $P_{O2}$ is achieved by controlling the gas flow ratio of buffered gases at a given anneal temperature, or by direct oxygen flow at a given anneal temperature. The $P_{O2}$ can be controlled by direct control of $O_2$ flow where the desired $P_{O2}$ is greater than or equal to $10^{-2}$ Torr. Typically, the $P_{O2}$ is controlled by direct $O_2$ flow only for large $P_{O2}$. For instance, where partial pressures are approximately or greater than $10^{-2}$ Torr.

Figure 4:
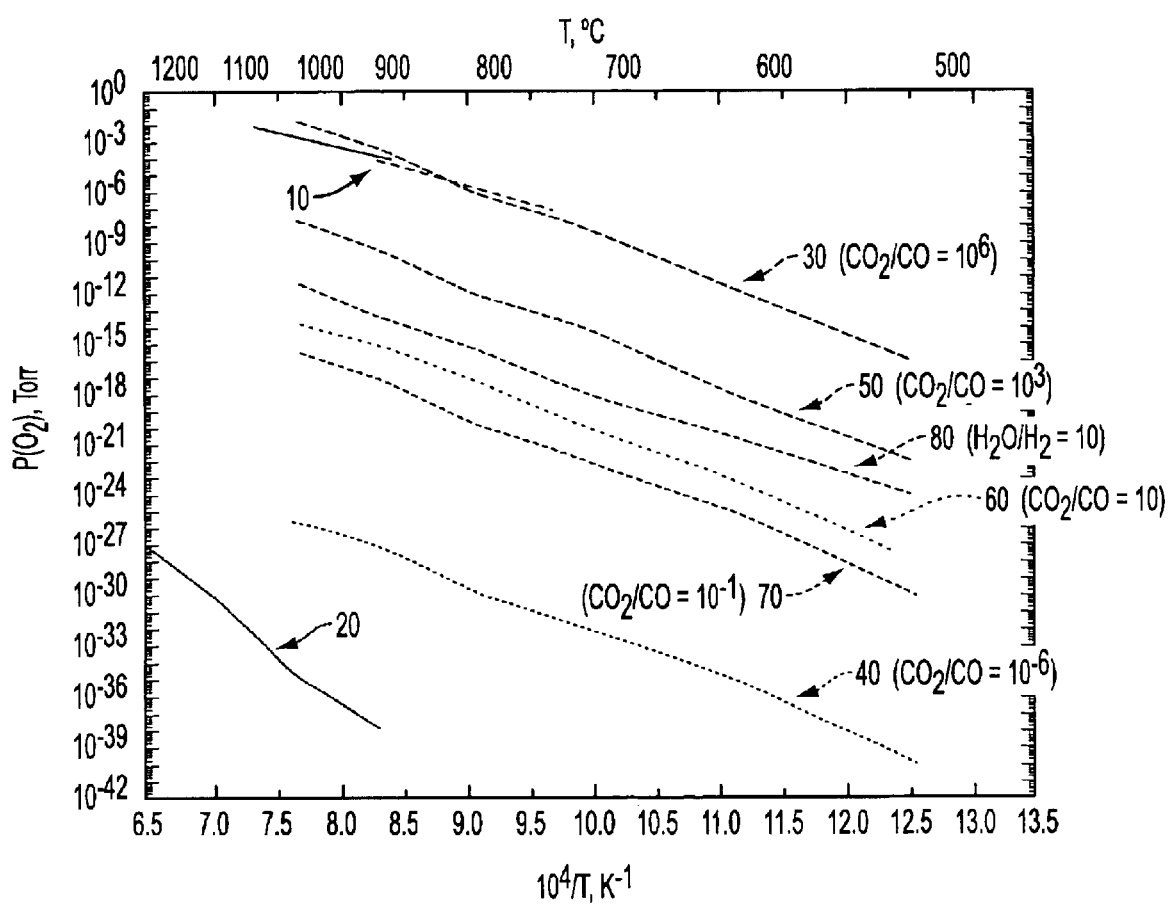
FIG. 4 is a graph illustrating $P_{O2}$ (partial pressure of oxygen) values achievable, as a function of temperature, for various buffered gas mixtures.

Lower values of the $P_{O2}$ (i.e., $P_{O2}$ less than $10^{-2}$ Torr) can be controlled by the flow rate ratio of gases such as $CO_2/CO$ (lines 30, 40, 50, 60, 70) or $H_2O/H_2$ (line 80) as shown in FIG. 4. The gas mixtures illustrated in FIG. 4 are known as buffered gas mixtures. As shown in FIG. 4, the present invention controls the $P_{O2}$ over a very large range when controlling the $CO_2/CO$ (lines 30, 40, 50, 60, 70) or $H_2O/H_2$ (line 80) gas flow ratios.

The different gas flow ratios of lines 30, 40, 50, 60, and 70 which FIG. 4 depicts, represent a particular ratio of $CO_2/CO$ gas mixture as a function of temperature. The chemical equilibrium between the buffered gas mixture gives rise to a certain $P_{O2}$ because CO, $CO_2$, and $O_2$ are related by the following chemical reaction: $CO_2 = CO + \frac{1}{2} O_2$.

Line 30 illustrates a $CO_2/CO$ ratio of $10^6$. Line 40 illustrates a $CO_2/CO$ ratio of $10^{-6}$. Line 50 illustrates a $CO_2/CO$ ratio of $10^3$. Line 60 illustrates a $CO_2/CO$ ratio of 10. Line 70 illustrates a $CO_2/CO$ ratio of $10^{-1}$. Line 80 illustrates an $H_2O/H$ ratio of 10. Additional ratios of $CO_2/CO$ mixtures or $H_2O/H_2$ mixtures as a function of temperature could easily be used to affect the $P_{O2}$ depending upon the desired buffered annealing environment. FIG. 4 illustrates examples of the various $P_{O2}$ values achievable through different buffered gas mixtures at particular temperatures; other values could easily be illustrated.

In an exemplary embodiment, the high-K metal oxide dielectric layer undergoes a buffered anneal process utilizing a buffered gas mixture of $CO_2/CO$ rather than $H_2O/H_2$. The $CO_2/CO$ buffered gas mixture is preferred since at temperatures equal to or greater than 700° C., the presence of $H_2$ may reduce the high-K metal oxide dielectric layer by the chemical reduction reaction $M_xO_y + yH_2 = xM + yH_2O$.

The invention can also provide a reduction in the fixed charge of the high-K metal oxide dielectric layer by providing a more stoichiometric metal oxide layer. Stoichiometry of the metal oxide layer can be influenced by the value of $P_{O2}$ used during an anneal. As a result, selecting a certain buffered anneal environment at a given anneal temperature, can enable one to exert control over and affect the overall metal oxide stoichiometry and its fixed charge.

Current methods of fabricating high-K metal oxide dielectric layers result in layers that have a fixed charge of at least $10^{12}/cm^2$; whereas, using the methods of the present invention, a metal oxide dielectric layer can be fabricated possessing a fixed charge significantly lower than $10^{12}/cm^2$. A high-K metal oxide dielectric layer with a fixed charge of approximately $10^{11}/cm^2$ can be fabricated utilizing the buffered anneal conditions of the invention. The reduction in fixed charge is due to the high-K metal oxide dielectric layer being substantially closer to its stoichiometric state.

Thus, if the high-K metal oxide dielectric layer is annealed under conditions which are below the $SiO/SiO_2$ thermodynamic chemical equilibrium line 10 and closer to the thermodynamic chemical equilibrium line of the metal oxide (i.e., closer to line 20 of FIG. 3 for $Al_2O_3$), a more stoichiometric metal oxide dielectric layer is produced having a reduced fixed net charge. Thus, the closer the anneal conditions are for the thermodynamic chemical equilibrium of the metal oxide dielectric layer (i.e., line 20 for $Al_2O_3$) the lower the net fixed charge of the metal oxide dielectric layer.

A buffered anneal of the metal oxide dielectric layer in the presence of an optional interfacial layer such as $SiO_2$, shown in FIG. 2B, is now described. It is well-known that the morphology and chemistry of the silicon substrate 3 and $SiO_2$ interfacial region 2, which is present to some degree underneath the high-K metal oxide dielectric layer 1, is dramatically affected by the value of $P_{O2}$ during an anneal. Thus, proper selection of the $P_{O2}$ can play a pivotal role in intermixing and restructuring this $Si/SiO_2$ interfacial region for enhanced smoothness.

Figure 1:
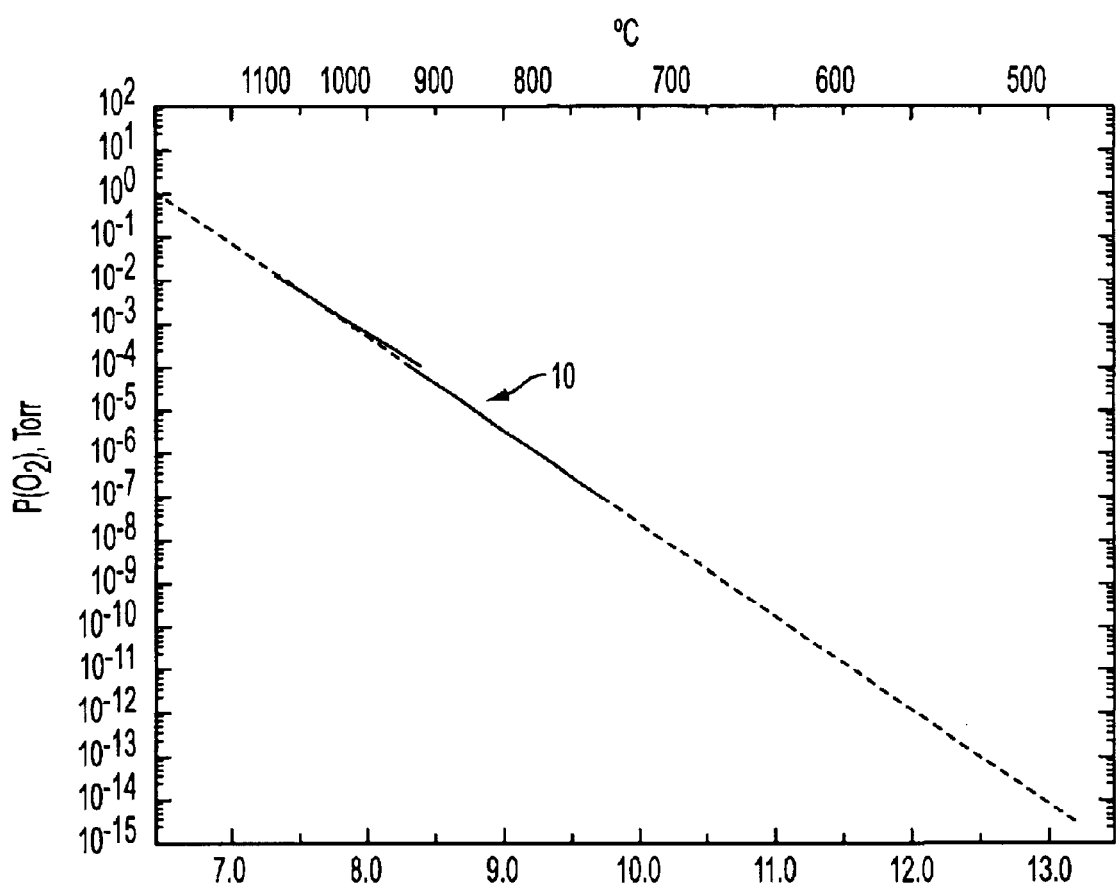
FIG. 1 is a graph illustrating the thermodynamic chemical equilibrium between silicon oxide (SiO) and silicon dioxide ($SiO_2$) in different regimes of temperature and partial pressure of oxygen.

FIGS. 1 and 3 graphically illustrate in a $P_{O2}$ and temperature regime, the stable $SiO_2$ regime which is found at and above line 10. At and above line 10, silicon reacts in the presence of oxygen and preferentially forms $SiO_2$. FIGS. 1 and 3 also illustrate the unstable $SiO_2$ regime which occurs below line 10 where silicon reacts in the presence of oxygen and forms SiO; a volatile compound. Under ideal annealing conditions, $SiO_2$ is completely stable and minimum reoxidation results when the anneal occurs at or near the $SiO/SiO_2$ thermodynamic chemical equilibrium line 10.

It is desirable that the buffered anneal process occur in the higher portions of the anneal parameter ranges, depicted in FIG. 3, which are closer to or at, but not above, the thermodynamic chemical equilibrium line 10 for $SiO/SiO_2$. Buffered annealing conditions where the $P_{O2}$ and temperature are selected close to or at the $SiO_2$ thermodynamic chemical equilibrium line 10, provides for minimal disruption of the $Si/SiO_2$ interface. Specifically, below the thermodynamic chemical equilibrium line 10 there is no silicon dioxide growth at the existing interfacial layer. At or slightly above the thermodynamic chemical equilibrium line 10, approximately zero A° to approximately 2 A° of silicon dioxide is added to the interfacial layer as a result of the buffered anneal process when the process is carried out close to but below the thermodynamic chemical equilibrium line 10. As a result, although the invention provides wide latitude for annealing the high-K metal oxide dielectric layer, it is preferably annealed with a $P_{O2}$ in a range of approximately 10 Torr to approximately $10^{-20}$ Torr, and at a temperature ranging from approximately 400° C. to approximately 1200° C.

As noted, when annealing conditions are chosen that occur below the FIG. 3 thermodynamic chemical equilibrium line 10, the anneal results in the $SiO_2$ layer (i.e., interfacial layer) decomposing into SiO. Typically, decomposition of $SiO_2$ is undesirable. However, in some instances decomposition of $SiO_2$ can be desirable. Silicate formation occurs by a reaction between the $SiO_2$ layer (i.e., interfacial layer) and the metal oxide dielectric layer. Thus, portions of the decomposing $SiO_2$ layer (i.e., SiO) react with the high-K gate dielectric layer forming a silicate structure. The resulting silicate structure may be desirable since silicates are viable high-K gate structures with dielectric constants greater than 3.9 (i.e., greater than the dielectric constant of silicon dioxide).

Although the anneal conditions described above are carried out in a single anneal for the metal oxide dielectric layer and for any present interfacial layer, the buffered anneal process of the invention can also be carried out in multiple steps. Referring to FIG. 2A, where a high-K metal oxide dielectric layer 1 is provided as a first layer directly over the substrate 3, this layer can first be annealed in a buffered environment containing oxygen which occurs at or near the thermodynamic chemical equilibrium line of the metal oxide dielectric layer (i.e., line 20 of FIG. 3 for $Al_2O_3$) bringing the metal oxide to near or at its stoichiometric point.

An interfacial layer 2, illustrated in FIG. 2B, may then be created after the first anneal is completed. Alternatively, the interfacial layer 2, if already present to some degree, can be reoxidized as desired to enhance the interfacial region. The high-K metal oxide dielectric layer 1, the interfacial layer 2, and substrate 3 are then annealed in a buffered atmosphere containing oxygen in a second buffered anneal. The second buffered anneal is carried out under conditions at or very close to the thermodynamic chemical equilibrium line of $SiO/SiO_2$, that is, line 10 in FIGS. 1 and 3. The second buffered anneal is preferably not carried out under conditions existing below line 10 as $SiO_2$ would not reoxidize, but decompose into SiO.

Figure 5:
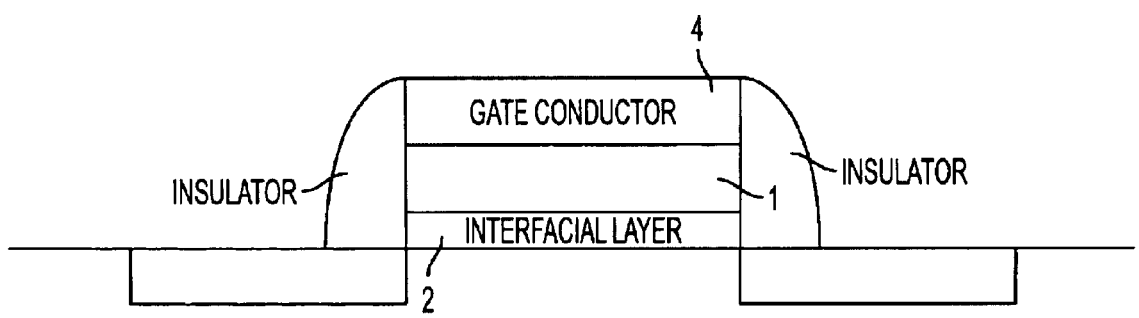
FIG. 5 is a cross-sectional view of a transistor structure constructed in accordance with the present invention.

After the one or multiple step buffered anneal process of the invention is completed, a high-K metal oxide dielectric is formed that has a fixed charge of greater than approximately $10^{10}/cm^2$ and less than approximately $10^{12}/cm^2$. The interfacial layer 2, if present during the buffered anneal, increases in thickness by approximately zero A° to approximately 2 A° resulting in substantially less reoxidation of the interfacial layer 2. The buffer annealed metal oxide dielectric layer 1, produced in accordance with the invention, can be used as a gate oxide with a gate conductor 4 provided on top of the gate oxide layer in a transistor, as shown in FIG. 5, or in other semiconductor structures such as a dielectric layer in a capacitor.

The above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A method of forming a semiconductor structure comprising the steps of:
   forming a metal oxide dielectric layer over a semiconductor substrate; and,
   annealing said dielectric layer using an oxygen atmosphere buffered anneal process in which a partial pressure of oxygen is controlled such that annealing occurs at or below the thermodynamic chemical equilibrium of $SiO/SiO_2$ and at or above the thermodynamic chemical equilibrium of said dielectric layer.

2. The method as in claim 1, further comprising forming an interfacial layer between said metal oxide dielectric layer and said substrate prior to said annealing, said interfacial layer comprising a material selected from the group consisting of silicon dioxide, silicon oxynitride, and a chemically-prepared silicon oxide.

3. The method as in claim 1, wherein said metal oxide dielectric layer comprises a layer selected from the group consisting of a unary, binary, and ternary metal oxide layer.

4. The method as in claim 1, wherein said metal oxide dielectric layer is formed in combination with $SiO_2$, forming a silicate layer.

5. The method as in claim 1, wherein said metal oxide dielectric layer is formed in combination with $Al_2O_3$, forming an aluminate layer.

6. The method as in claim 1, wherein said metal oxide dielectric layer comprises $Al_2O_3$.

7. The method as in claim 1, wherein said annealing is conducted in a manner which causes said formed metal oxide dielectric layer to have a composition that is approximately stoichiometric.

8. The method as in claim 1, wherein said control of the partial pressure of oxygen is performed by direct control of oxygen flow.

9. The method as in claim 1, wherein said control of the partial pressure of oxygen is performed by controlling the gas flow ratio of a buffered gas mixture.

10. The method as in claim 9, wherein said buffered gas mixture comprises a gas mixture selected from the group consisting of a $CO_2/CO$ mixture and an $H_2O/H_2$ mixture.

11. A method of forming a semiconductor structure comprising the steps of:

forming a metal oxide dielectric layer over a semiconductor substrate; and, annealing said dielectric layer using an oxygen atmosphere buffered anneal process in which a partial pressure of oxygen is controlled such that annealing occurs at or near the thermodynamic chemical equilibrium of said dielectric layer.

12. The method as in claim 11, further comprising forming an interfacial layer between said metal oxide dielectric layer and said substrate prior to said annealing, said interfacial layer comprising a material selected from the group consisting of silicon dioxide, silicon oxynitride, and a chemically-prepared silicon oxide.

13. The method as in claim 11, wherein said metal oxide dielectric layer comprises a layer selected from the group consisting of a unary, binary, and ternary metal oxide layer.

14. The method as in claim 11, wherein said buffered annealing process is conducted in a manner which causes said formed metal oxide dielectric layer to have a composition that is approximately stoichiometric.

15. The method as in claim 11, wherein said control of the partial pressure of oxygen is performed by direct control of oxygen flow.

16. The method as in claim 11, wherein said control of the partial pressure of oxygen in is performed by controlling the gas flow ratio of a buffered gas mixture.

17. The method as in claim 16, wherein said buffered gas mixture comprises a gas mixture selected from the group consisting of a $CO_2/CO$ mixture and an $H_2O/H_2$ mixture.

18. The method of as in claim 11, further comprising annealing said dielectric layer in a second oxygen atmosphere buffered anneal process in which a partial pressure of oxygen is controlled such that annealing occurs at or near the thermodynamic equilibrium of $SiO/SiO_2$.

* * * * *